(12) United States Patent
Jang et al.

(10) Patent No.: US 7,957,434 B2
(45) Date of Patent: Jun. 7, 2011

(54) LIGHT EMITTING DEVICE AND FABRICATION METHOD THEREOF

(75) Inventors: Eun Joo Jang, Suwon-si (KR); Shin Ae Jun, Seongnam-si (KR); Hyo Sook Jang, Seongnam-si (KR); Jung Eun Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 47 days.

(21) Appl. No.: 12/289,948

(22) Filed: Nov. 7, 2008

(65) Prior Publication Data

US 2009/0274188 A1 Nov. 5, 2009

(30) Foreign Application Priority Data

May 1, 2008 (KR) .................. 10-2008-0041004

(51) Int. Cl.
*H01S 3/10* (2006.01)
(52) U.S. Cl. ........................... 372/21; 372/22
(58) Field of Classification Search .................... 372/21, 372/22
See application file for complete search history.

(56) References Cited

U.S. PATENT DOCUMENTS

| 2008/0265268 A1* | 10/2008 | Braune et al. | 257/98 |
| 2009/0127576 A1* | 5/2009 | Jang et al. | 257/98 |
| 2009/0134412 A1* | 5/2009 | Shylo et al. | 257/98 |

FOREIGN PATENT DOCUMENTS

| JP | 2004-235261 | 8/2004 |
| KR | 10-2004-0010107 | 1/2004 |
| KR | 10-2007-0067478 | 6/2007 |

* cited by examiner

*Primary Examiner* — Armando Rodriguez
(74) *Attorney, Agent, or Firm* — Cantor Colburn LLP

(57) ABSTRACT

Disclosed herein is a light emitting device with improved life characteristics. The light emitting device comprises a circuit board having a recess, a reflection plane and an excitation source disposed in the recess, an overmolding overlying the reflection plane and the excitation source, a surface-inducing film formed on the overmolding, and a light conversion layer overlying the surface-inducing film. Also disclosed herein is a method for fabricating the light emitting device.

18 Claims, 4 Drawing Sheets

(2 of 4 Drawing Sheet(s) Filed in Color)

LIGHT EMITTING DEVICE AND FABRICATION METHOD THEREOF

This non-provisional application claims priority to Korean Patent Application No. 10-2008-41004, filed on May 1, 2008, and all the benefits accruing therefrom under U.S.C. §119, the entire contents of which is incorporated herein in its entirety by reference.

BACKGROUND

1. Field

This disclosure is directed to a light emitting device with improved life characteristics and a method for fabricating the light emitting device.

2. Description of the Related Art

Displays are becoming increasingly important tools for the transmission of information in current information society. With recent remarkable advances in display technology, considerable research efforts have been directed towards the development of light emitting devices that are smaller in size and longer in lifetime than existing light sources.

Particularly, light emitting diodes (LEDs) have longer lifetime than any other known light source, and possess the advantages of reduced power consumption and high efficiency because they directly convert electrical energy into light energy. Based on these advantages, light emitting devices including LEDs have attracted much attention as next-generation light sources for displays and lighting systems. Continuous efforts have been made to develop light emitting devices with improved life characteristics as well as high luminescence efficiency and good color reproducibility. For example, many attempts to introduce a light conversion layer on top of a light source have been made to achieve good color reproducibility over the entire region. Organic phosphors are typically used as luminescent materials for light emitting layers. More recently, semiconductor nanocrystals with good color purity have been investigated as luminescent materials for light conversion layers.

Numerous methods associated with improvements in the life characteristics of light emitting devices have been developed through the use or development of new light sources with high luminescence efficiency, the use or development of new luminescent materials with high luminescence efficiency for light conversion layers, the new structures of light emitting devices designed so as to have high luminescence efficiency, the improvement in the reflectance of light sources, etc. A particularly important factor determining the life characteristics of light emitting devices is to ensure the durability of the light emitting devices.

Research efforts to improve the durability of light emitting devices are still in very early stages and further investigations are currently in progress. In addition, there are continuing efforts to develop light emitting devices with improved lifetime and stability.

SUMMARY

Disclosed herein is a light emitting device which comprises a circuit board having a recess, a reflection plane and an excitation source disposed in the recess, an overmolding overlying the reflection plane and the excitation source, a surface-inducing film formed on the overmolding, and a light conversion layer overlying the surface-inducing film.

The overmolding is formed of an epoxy or silicone polymeric material and has a refractive index between the refractive indices of the excitation source and air.

The surface-inducing film may be a transparent polymer film, a transparent glass film, or a transparent polymer film blended with transparent fine particles. The transparent polymer film may be made of at least one resin selected from the group consisting of acetate resins, e.g., triacetyl cellulose (TAC), polyester resins, polyethersulfone resins, polysulfone resins, polycarbonate resins, polyolefin resins, polyallylate resins, polystyrene resins, polyvinyl alcohol resins, polyvinyl chloride resins, polyvinylidene chloride resins, and polyacrylic resins. The fine particles may be made of at least one material selected from the group consisting of silica, alumina, titania, zirconia, tin oxide, indium oxide, cadmium oxide and antimony oxide.

The excitation source may be a light emitting diode (LED) chip or a semiconductor laser that preferably emits light in the wavelength range of 200 to 2,000 nm, including UV and visible wavelengths.

The light conversion layer may contain at least one luminescent material selected from the group consisting of nanocrystals, inorganic phosphors and organic phosphors. The light conversion layer preferably absorbs light from the excitation source to emit light with a higher or lower energy than the absorbed light. The nanocrystals may be semiconductor nanocrystals of at least one compound selected from Group II-VI compounds, Group III-V compounds, Group IV-VI compounds and Group IV compounds. The light conversion layer may be a luminescent material-metal oxide composite film or a luminescent material-polymer composite film.

The light conversion layer may include two or more layers whose emission wavelength ranges are different from the emission wavelength range of the excitation source. The constituent layers of the light conversion layer preferably emit light in different wavelength ranges.

The light emitting device has improved life characteristics.

Disclosed herein too is a method for fabricating a light emitting device with improved life characteristics, which comprises preparing a circuit board having a recess in which a reflection plane and an excitation source are disposed, applying a resin within the recess of the circuit board to form an overmolding covering the reflection plane and the excitation source, forming a surface-inducing film on the overmolding, curing the resin (primary curing), forming a light conversion layer on the surface-inducing film, and curing the resulting structure (secondary curing).

BRIEF DESCRIPTION OF THE DRAWINGS

The patent or application file contains at least one drawing executed in color. Copies of this patent or patent application publication with color drawings will be provided by the office upon request and payment of the necessary fee.

Example embodiments will be more clearly understood from the following detailed description taken in conjunction with the accompanying drawings, in which.

DETAILED DESCRIPTION

Hereinafter, a detailed description will be given of example embodiments with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms "first", "second", "third", and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to one exemplary embodiment, there is provided a light emitting device which comprises a circuit board having a recess, a reflection plane and an excitation source disposed on the bottom of the recess, an overmolding overlying the reflection plane and the excitation source, a surface-inducing film formed on the overmolding, and a light conversion layer overlying the surface-inducing film.

Due to the presence of the overmolding and the surface-inducing film between the excitation source and the light conversion layer, the light emitting device exhibits improved life characteristics after operation compared to conventional light emitting devices.

Figure 1:
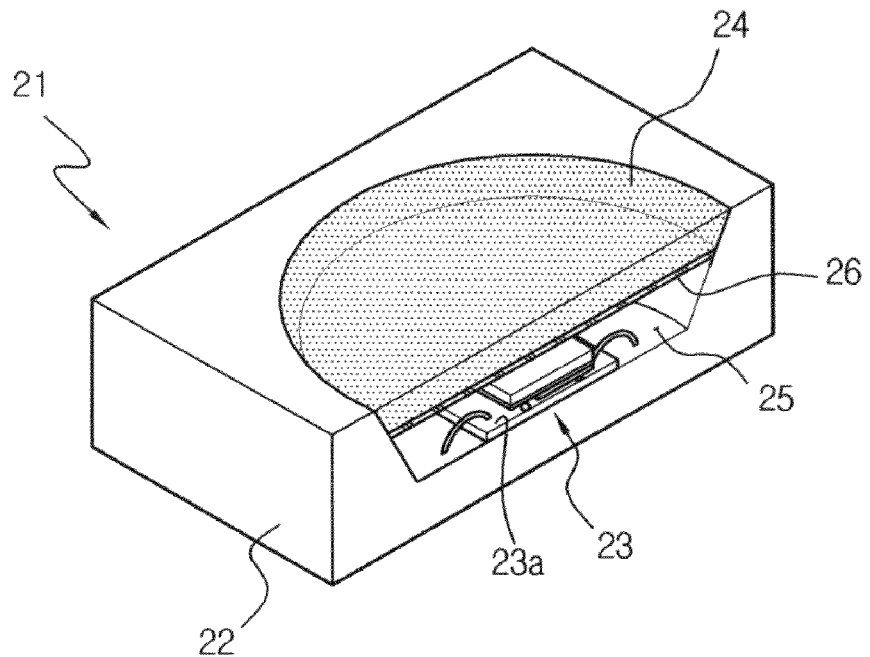
FIG. 1 is an exemplary sectional perspective view of a light emitting device.

FIG. 1 is a sectional perspective view of the light emitting device of this embodiment. Referring to FIG. 1, the light emitting device 21 comprises a flat overmolding 25 that completely covers an excitation source 23 mounted on the bottom surface of a recess of a circuit board 22 and a reflection plane 23a formed in the recess to minimize damage resulting from the exposure of important portions of the reflection plane or the excitation source to external materials.

The overmolding 25 may be formed of a general packaging resin, for example, an epoxy or silicone polymer. The overmolding 25 has a refractive index between the refractive indices of the excitation source 23 and air. In the fabrication of the light emitting device, the overmolding 25 is formed by applying a resin to the upper surfaces of the reflection plane 23a and the excitation source 23, which are mounted on the bottom of the recess of the circuit board 22, to embed the reflection plane 23a and the excitation source 23, followed by curing the resin. Most portions of the resin undergo variations in viscosity in the curing step. At the time when a sharp decrease in the viscosity of the resin occurs, a meniscus is formed along the surface of the recess due to surface tension. Accordingly, a conventional light emitting device has the problems that it is difficult to form an overmolding having an ideally flat surface and important portions of a reflection plane and an excitation source mounted on the bottom of a recess are exposed. This exposure causes mixing of a material for a light conversion layer and a resin for the overmolding to thereby impede curing of the resin. A portion of the resin remains uncured and is degraded by heat generated during operation of the conventional light emitting device to cause damage to the reflection plane or the excitation source, resulting in deterioration in the life characteristics of the conventional light emitting device.

In contrast, in the light emitting device 21 of example embodiments, the surface-inducing film 26 is formed between the overmolding 25 and the light conversion layer 24. The surface-inducing film 26 provides an additional surface to make the resin of the overmolding 25 flat after being cured.

The surface-inducing film 26 completely covers the reflection plane and the excitation source 23 in such a way that the surface of the overmolding 25 is flattened to block mixing of the reflection plane 23a and the excitation source 23 with a luminescent material for the light conversion layer 24, which is formed on the surface-inducing film. In addition, the surface-inducing film 26 guarantees a constant distance between the excitation source 23 and the luminescent material for the light conversion layer 24 to minimize damage to the light conversion layer 24 by heat emitted from the excitation source 23.

There is no particular restriction on the form of the surface-inducing film 26 so long as the film can withstand the fabrication conditions (e.g., curing temperature) of the light emitting device. Preferably, the film has a thickness as small as possible and is not bulky. The film has a refractive index similar to that of the resin for the overmolding 25 to pass light from the light source therethrough.

Figure 6:
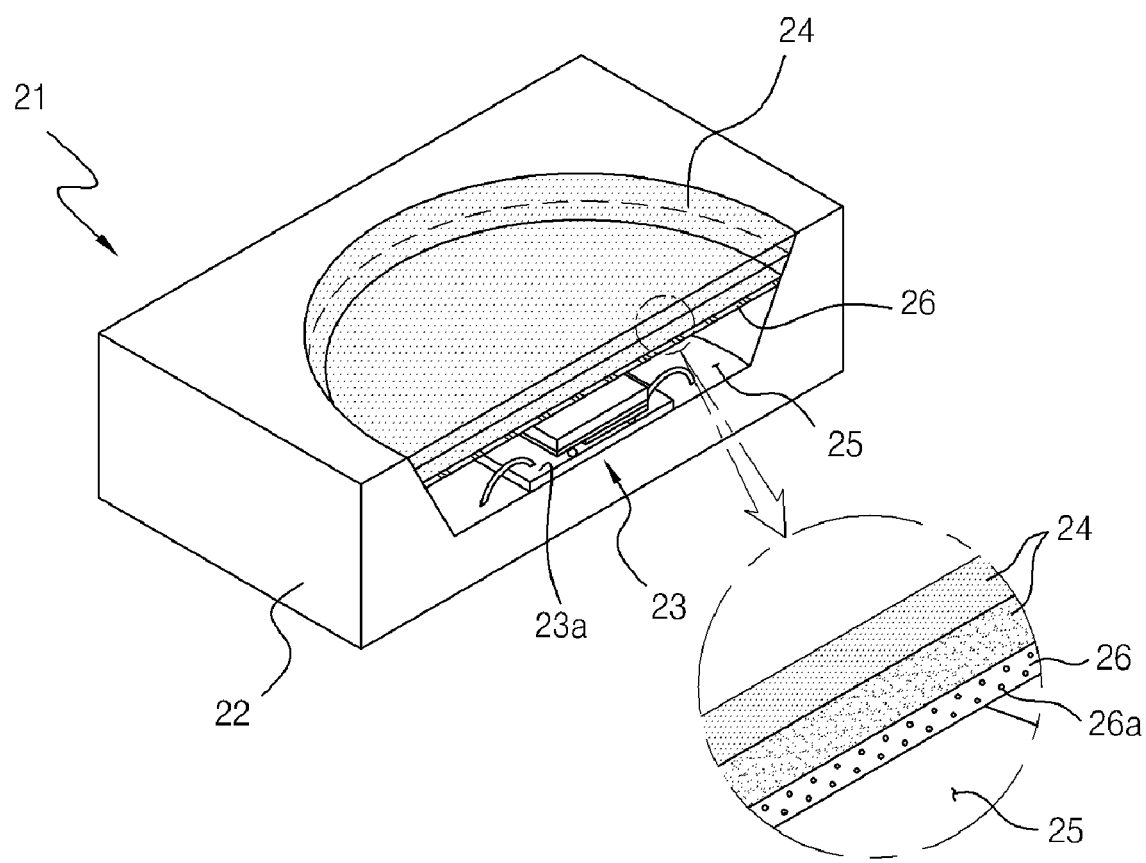
FIG. 6 is a sectional view of a light emitting device illustrating exemplary embodiments.

For example, the surface-inducing film 26 may be a polymer or glass film that does not substantially absorb light from the excitation source, or a transparent polymer film blended with transparent fine particles 26a as illustrated in FIG. 6. The polymer film is preferably made of a highly transparent polymer or glass. Specific examples of suitable transparent polymers include acetate resins, e.g., triacetyl cellulose (TAC), polyester resins, polyethersulfone resins, polysulfone resins, polycarbonate resins, polyolefin resins, polyallylate resins, polystyrene resins, polyvinyl alcohol resins, polyvinyl chloride resins, polyvinylidene chloride resins, and polyacrylic resins, and a combination thereof. The fine transparent particles 26a may be made of at least one material selected from the group consisting of silica, alumina, titania, zirconia, tin oxide, indium oxide, cadmium oxide and antimony oxide.

The overmolding 25 may be formed of a commercially available polydimethylsiloxane (PDMS) resin. Since the PDMS resin is highly porous, it is preferable that the surface-inducing film 26 be made of a non-porous material to better protect the reflection plane 23a and the excitation source 23.

The excitation source is used as a light source of the light emitting device. In an embodiment, the excitation source may be a light emitting diode (LED) or a semiconductor laser. No particular limitation is imposed on the emission wavelength range of the excitation source. The excitation source preferably emits light in the wavelength range of 200 to 2,000 nm, including UV and visible wavelengths.

In an embodiment, the light conversion layer 24 may be formed of a luminescent material selected from nanocrystals, inorganic phosphors, organic phosphors and mixtures thereof. The light conversion layer 24 contains a material that absorbs light from the excitation source 23 to emit light with a higher or lower energy than the absorbed light. The inorganic and organic phosphors include those that are commonly used in the art. The nanocrystals are semiconductor nanocrystals of at least one compound selected from Group II-VI compounds, Group III-V compounds, Group IV-VI compounds and Group IV compounds.

The Group II-VI compounds are selected from the group consisting of, but not necessarily limited to: binary compounds, e.g., CdS, CdSe, CdTe, ZnS, ZnSe, ZnTe, ZnO, HgS, HgSe and HgTe; ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and quaternary compounds, e.g., CdZnSeS, CdZnSeTe, CdZnSTe, CdHgSeS, CdHgSeTe, CdHgSTe, HgZnSeS, HgZnSeTe and HgZnSTe. The Group III-V compounds are selected from the group consisting of, but not necessarily limited to: binary compounds, e.g., GaN, GaP, GaAs, GaSb, AlN, AlP, AlAs, AlSb, InN, InP, InAs and InSb; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs and AlInSb; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. The Group IV-VI compounds are selected from the group consisting of, but not necessarily limited to: binary compounds, e.g., SnS, SnSe, SnTe, PbS, PbSe and PbTe; ternary compounds, e.g., SnSeS, SnSeTe, SnSTe, PbSeS, PbSeTe, PbSTe, SnPbS, SnPbSe and SnPbTe; and quaternary compounds, e.g., SnPbSSe, SnPbSeTe and SnPbSTe. The Group IV compounds are selected from the group consisting of, but not necessarily limited to: unary compounds, e.g., Si and Ge; and binary compounds, e.g., SiC and SiGe.

The semiconductor nanocrystals may further include an overcoating to form a core-shell structure. The semiconductor nanocrystals may have a multilayer structure composed of a core and at least one layer. The overcoating or the constituent layer of the multilayer may be formed of a material selected from Group II-VI compounds, Group III-V compounds, Group IV-VI compounds, Group IV compounds and mixtures thereof.

The Group II-VI compounds are selected from the group consisting of: binary compounds, e.g., CdS, CdSe, CdTe, ZnS, ZnSe, ZnTe, ZnO, HgS, HgSe and HgTe; ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and quaternary compounds, e.g., CdZnSeS, CdZnSeTe, CdZnSTe, CdHgSeS, CdHgSeTe, CdHgSTe, HgZnSeS, HgZnSeTe and HgZnSTe. The Group III-V compounds are selected from the group consisting of: binary compounds, e.g., GaN, GaP, GaAs, GaSb, AlN, AlP, AlAs, AlSb, InN, InP, InAs and InSb; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs and AlInSb; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb. The Group IV-VI compounds are selected from the group consisting of: binary compounds, e.g., SnS, SnSe, SnTe, PbS, PbSe and PbTe; ternary compounds, e.g., SnSeS, SnSeTe, SnSTe, PbSeS, PbSeTe, PbSTe, SnPbS, SnPbSe and SnPbTe; and quaternary compounds, e.g., SnPbSSe, SnPbSeTe and SnPbSTe. The Group IV compounds are selected from the group consisting of: unary compounds, e.g., Si and Ge; and binary compounds, e.g., SiC and SiGe.

In an embodiment, the light conversion layer may be a luminescent material-metal oxide composite film or a luminescent material-polymer composite film. The metal oxide mixed with the luminescent material may be a transparent material that does not substantially absorb the emission wavelength of light from the excitation source. Suitable transparent materials include $TiO_2$, $ZnO$, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, $CeO$ and $CrO_3$, and mixtures thereof. Polymeric materials that can be mixed with the luminescent material are transparent materials that do not substantially absorb the emission wavelength of light from the excitation source, and examples thereof include styrene, acrylate, carbonate, ethylene, siloxane and epoxy polymers.

In an embodiment, the light conversion layer may be formed on a transparent substrate. The transparent substrate may be of any type so long as light from the excitation source can pass therethrough. Examples of suitable materials for the transparent substrate include glass, quartz and polymers.

The thickness of the light conversion layer may be 50 to 1,000 μm where about 10 to about 100% of the emission wavelengths of the excitation source can be converted, but is not particularly limited to this range.

As illustrated in FIG. 6, the light conversion layer 24 may include two or more layers whose emission wavelength ranges are different from the emission wavelength range of the excitation source. The constituent layers of the light conversion layer preferably emit light in different wavelength ranges. The constituent layers may be arranged in such a manner that their emission wavelength ranges increase or decrease with increasing distance from the excitation source.

The emission wavelengths of the light conversion layer are determined according to those of the nanocrystals. The light conversion layer may have an emission wavelength range of 470 to 2,000 nm where it can absorb light from the excitation source to emit light, but is not especially limited to this range.

In accordance with another embodiment, there is provided a method for fabricating a light emitting device, which comprises preparing a circuit board having a recess on which a reflection plane is formed and an excitation source are mounted, applying a resin within the recess of the circuit board to form an overmolding covering the reflection plane and the excitation source, forming a surface-inducing film on the overmolding, curing the resin (primary curing), forming a light conversion layer on the surface-inducing film, and curing the resulting structure (secondary curing).

As previously explained, due to the presence of the flat overmolding completely covering the reflection plane and the excitation source, the life characteristics of the light emitting device can be improved. According to the method, a resin is applied to the surfaces of a reflection plane and an excitation source to form an overmolding, a surface-inducing film is formed thereon, followed by primary curing. Despite variations in the viscosity of the resin in the curing step, the surface-inducing film provides an additional surface to make the surface of the overmolding flat, unlike in prior art fabrication methods of light emitting devices. After the primary curing, a light conversion layer is formed on the surface-inducing film and secondarily cured to fabricate the desired light emitting device. The light emitting device exhibits improved life characteristics after operation, compared to conventional light emitting devices. The primary curing is preferably conducted at a temperature lower than 200° C. The surface-inducing film is preferably made of a material stable up to the curing temperature.

The overmolding 25 may be formed of a general packaging resin, for example, an epoxy or silicone polymer. The overmolding 25 has a refractive index between the refractive indices of the excitation source and air.

The surface-inducing film 26 may be a polymer or glass film that does not substantially absorb light from the excitation source, or a polymer film blended with fine particles. The polymer film is preferably made of a highly transparent polymer. Specific examples of suitable transparent polymers include acetate resins, e.g., triacetyl cellulose (TAC), polyester resins, polyethersulfone resins, polysulfone resins, polycarbonate resins, polyolefin resins, polyallylate resins, polystyrene resins, polyvinyl alcohol resins, polyvinyl chloride resins, polyvinylidene chloride resins, and polyacrylic resins. The fine particles may be made of at least one material selected from the group consisting of silica, alumina, titania, zirconia, tin oxide, indium oxide, cadmium oxide and antimony oxide. The surface-inducing film 26 may have a refractive index between the refractive indices of air and the light conversion layer.

The overmolding 25 may be formed of a commercially available polydimethylsiloxane (PDMS) resin. Since the PDMS resin is highly porous, it is preferable that the surface-inducing film 26 be made of a non-porous material to better protect the reflection plane 23a and the excitation source 23.

The excitation source may be a light emitting diode (LED) chip or a semiconductor laser. No particular limitation is imposed on the emission wavelength range of the excitation source. The excitation source preferably emits light in the wavelength range of 200 to 2,000 nm, including UV and visible wavelengths.

In an embodiment, the light conversion layer 24 may be formed of at least one luminescent material selected from the group consisting of nanocrystals, inorganic phosphors and organic phosphors. The light conversion layer 24 contains a luminescent material that absorbs light from the excitation source 23 to emit light with a higher or lower energy than the absorbed light. The inorganic and organic phosphors may be those that are commonly used in the art. The nanocrystals are semiconductor nanocrystals of at least one compound selected from Group II-VI compounds, Group III-V compounds, Group IV-VI compounds and Group IV compounds.

The semiconductor nanocrystals may further include an overcoating to form a core-shell structure. The semiconductor nanocrystals may have a multilayer structure composed of a core and at least one layer. The overcoating or the constituent layer of the multilayer may be formed of a material selected from Group II-VI compounds, Group III-V compounds, Group IV-VI compounds, Group IV compounds and mixtures thereof.

A better understanding of exemplary embodiments will be described in more detail with reference to the following examples. However, these examples are given merely for the purpose of illustration and are not to be construed as limiting the scope of the embodiments.

EXAMPLES

Preparative Example 1

Synthesis of CdSe//ZnS/CdSZnS Nanocrystals 16 g of trioctylamine (TOA), 0.3 g of octadecylphosphonic acid and 0.4 mmol of cadmium oxide were simultaneously put into a 125-ml flask equipped with a reflux condenser. The mixture was allowed to react with stirring while maintaining the reaction temperature at 300° C. to obtain a reaction mixture.

Separately, a selenium (Se) powder was dissolved in trioctylphosphine (TOP) to obtain a Se-TOP complex solution (Se concentration: ca. 2 M). 2 mL of the Se-TOP complex solution was rapidly fed to the reaction mixture and the reaction was allowed to proceed for about 2 minutes.

After the reaction was finished, the reaction mixture was cooled to room temperature as rapidly as possible. Ethanol as a non-solvent was added to the reaction mixture, followed by centrifugation. The precipitate was separated from the supernatant and dispersed in toluene to prepare a dispersion of CdSe nanocrystals emitting light at 485 nm.

8 g of TOA, 0.1 g of oleic acid and 0.4 mmol of zinc acetate were simultaneously put into a 125-mL flask equipped with a reflux condenser. The mixture was allowed to react with stirring while maintaining the reaction temperature at 300° C. to obtain a reaction mixture. The CdSe nanocrystal solution was added to the reaction mixture, and then a S-TOP complex solution was slowly added thereto. The resulting mixture was allowed to react for about one hour to grow ZnS nanocrystals on the surfaces of the CdSe nanocrystals and diffuse the S-TOP complex solution along the interfaces between the CdSe nanocrystals to form CdSe//ZnS alloy nanocrystals.

After completion of the reaction, the reaction mixture was cooled to room temperature as rapidly as possible. Ethanol as a non-solvent was added to the reaction mixture, followed by centrifugation. The precipitate was separated from the supernatant and dispersed in toluene to prepare a dispersion of the CdSe//ZnS alloy nanocrystals. The CdSe//ZnS alloy nanocrystals were measured to have a size of 5 nm and emit light at 458 nm.

8 g of TOA, 0.1 g of oleic acid, 0.05 mmol of cadmium oxide and 0.4 mmol of zinc acetate were simultaneously put into a 125-mL flask equipped with a reflux condenser. The mixture was allowed to react with stirring while maintaining the reaction temperature at 300° C. to obtain a reaction mixture. The solution of the CdSe//ZnS nanocrystals was added to the reaction mixture, and then a S-TOP complex solution was slowly added thereto. The resulting mixture was allowed to react for about one hour to grow CdSZnS nanocrystals on the surfaces of the CdSe//ZnS nanocrystals. As a result, CdSe//ZnS/CdSZnS nanocrystals emitting light at 535 nm were prepared.

After completion of the reaction, the reaction mixture was cooled to room temperature as rapidly as possible. Ethanol as a non-solvent was added to the reaction mixture, followed by centrifugation. The precipitate was separated from the supernatant and dispersed in toluene to prepare a dispersion of the CdSe//ZnS/CdSZnS nanocrystals. The nanocrystals were found to have a quantum efficiency of 93%.

Example 1

Fabrication of Light Emitting Device

Hexane and ethanol were added in a volume ratio of 6:4 to the CdSe//ZnS/CdSZnS semiconductor nanocrystals prepared in Preparative Example 1, followed by centrifugation at 6,000 rpm for 10 minutes. The precipitate was collected and dispersed in 4 ml of toluene. 10 μl of the dispersion of the nanocrystals and 990 μl of toluene were placed in a quartz cuvette and measured for absorbance using a UV-Vis spectrometer. The solution was measured to have an optical density of 0.01 at the first absorption maximum. 1 ml of the solution was sampled, homogeneously mixed with 1 ml of a solution containing a PDMS resin (OE6630, Dow Corning) as a main material and a curing agent, and allowed to stand under vacuum for one hour to completely remove the toluene contained in the nanocrystals. As a result, a solution of nanocrystal-epoxy composites was prepared.

A circuit board having a recess was prepared. A silver (Ag) frame and a light emitting diode chip emitting blue light of 445 nm were mounted on the bottom of the recess of the circuit board. 5 μl of a PDMS resin (OE6630, Dow Corning) was applied within the recess of the circuit board to cover the Ag frame and the light emitting diode chip. Thereafter, a PET film having a size equal to the circular sectional area of the recess was placed on the PDMS resin. The resulting structure was stored in an oven for about one-hour while maintaining the temperature of the oven at 150° C. to cure the PDMS resin and was then cooled to room temperature. 15 μl of the nanocrystal-epoxy composite solution was uniformly coated on the PET film. The coated structure was stored in the oven for 2 hours while maintaining the temperature of the oven at 150° C. to cure the nanocrystal-epoxy composites, completing the fabrication of a nanocrystal light-emitting device.

Figure 2:
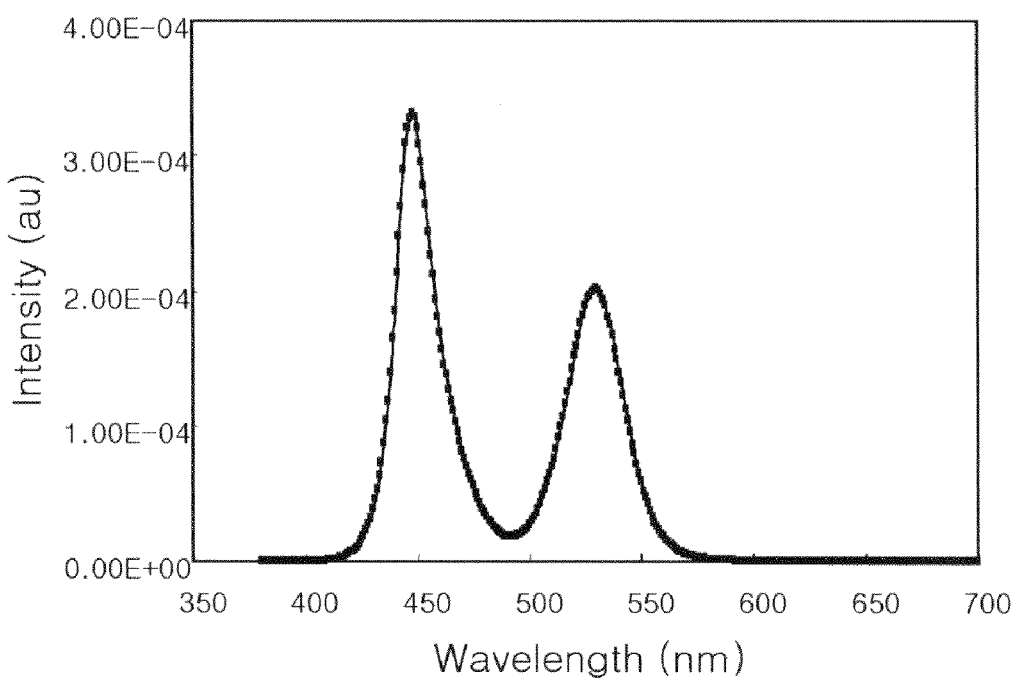
FIG. 2 is an emission spectrum of a light emitting device fabricated in Example 1.

After electric wires were connected to respective electrodes of the light-emitting device, a spectrometer (CAS140) equipped with an integrating sphere was used to measure the luminescence efficiency of the nanocrystal light-emitting device as a function of wavelength. The results are shown in FIG. 2.

Comparative Example 1

Fabrication of Light Emitting Device

A circuit board having a recess was prepared. A silver (Ag) frame and a light emitting diode chip emitting blue light of 445 nm were mounted on the bottom of the recess of the circuit board. 5 μl of a PDMS resin (OE6630, Dow Corning) was applied within the recess of the circuit board to cover the Ag frame and the light emitting diode chip. Thereafter, the resulting structure was stored in an oven for about one hour while maintaining the temperature of the oven at 150° C. to cure the PDMS resin and was then cooled to room temperature. At this time, the surface of the cured PDMS resin was not flattened. Then, 15 μl of the nanocrystal-epoxy composite solution was uniformly coated on the cured PDMS resin. The coated structure was stored in the oven for 2 hours while maintaining the temperature of the oven at about 150° C. to cure the nanocrystal-epoxy composites, completing the fabrication of a nanocrystal light-emitting device.

Test Example 1

Evaluation of Life Characteristics of Light Emitting Device

Figure 3:
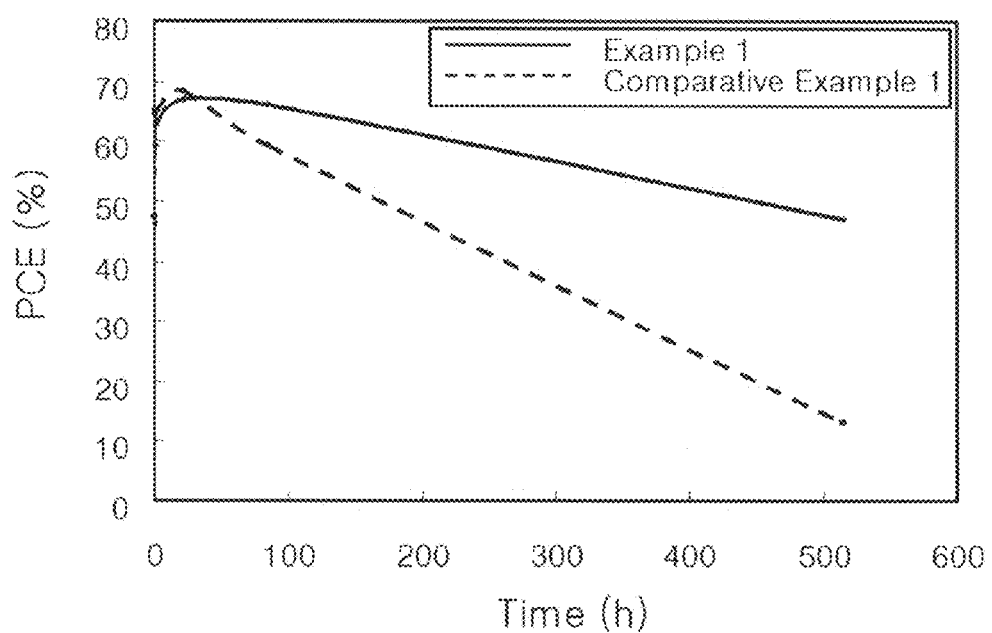
FIG. 3 is a graph showing the life characteristics of light emitting devices fabricated in Example 1 and Comparative Example 1.

The light emitting devices fabricated in Example 1 and Comparative Example 1 were operated at 60 mA for at least 500 hours. The luminescence efficiency of each of the light emitting devices was measured using a spectrometer (CAS140) equipped with an integrating sphere to calculate the power conversion efficiency (PCE). The life characteristics of the light emitting devices were plotted based on the power conversion efficiency (PCE) (FIG. 3). Photographs of the light emitting devices were taken after the operation (FIGS. 4 and 5).

Figure 4:
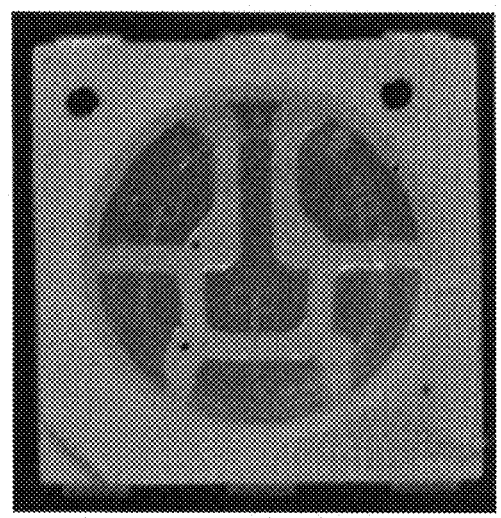
FIG. 4 is a photograph taken after operating a light emitting device fabricated in Example 1.
Figure 5:
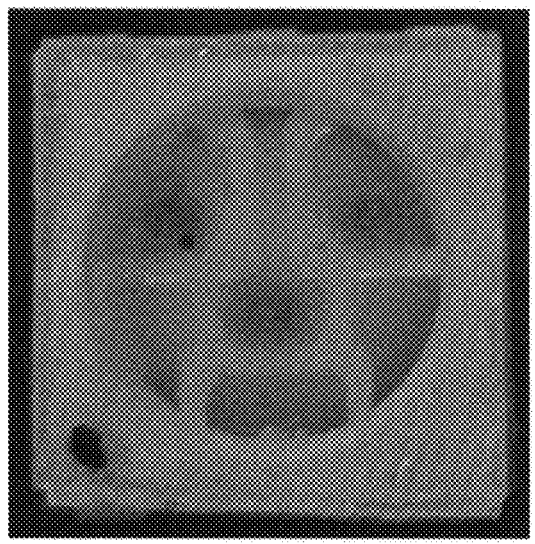
FIG. 5 is a photograph taken after operating a light emitting device fabricated in Comparative Example 1.

FIGS. 3 and 4 show that the surface of the overmolding of the light emitting device fabricated in Example 1 was maintained flat even after the primary curing to allow the overmolding to completely cover the Ag frame and the light emitting diode chip, and that the light emitting device was operated without damage to the Ag frame and the light emitting diode chip by the material for the light conversion layer. In contrast, FIGS. 3 and 5 show that the surface of the overmolding of the light emitting device fabricated in Comparative Example 1 was not flattened after the primary curing to thereby expose the Ag frame and the light emitting diode chip to the outside, and that the upper portion of the light emitting diode chip as an excitation source was burnt after operation. Further, these results reveal that the life characteristics of the comparative light emitting device were inferior and sharply degraded with the passage of time compared to the inventive light emitting device.

Although example embodiments have been disclosed for illustrative purposes, those skilled in the art will appreciate that various modifications, additions and substitutions are possible, without departing from the scope and spirit of the invention as disclosed in the accompanying claims.

What is claimed is:
1. A light emitting device, comprising
a circuit board having a recess,
a reflection plane and an excitation source mounted on the bottom of the recess,
an overmolding overlying the reflection plane and the excitation source,
a surface-inducing film formed on the overmolding, and
a light conversion layer overlying the surface-inducing film, wherein the surface-inducing film is a transparent polymer film, a transparent glass film, or a polymer film blended with transparent fine particles.
2. The light emitting device of claim 1, wherein the overmolding contains an epoxy or silicone polymer.
3. The light emitting device of claim 1, wherein the overmolding has a refractive index between the refractive indices of the excitation source and air.
4. The light emitting device of claim 1, wherein the transparent polymer film is made of at least one resin selected from the group consisting of triacetyl cellulose (TAC) resins, acetate resins, polyester resins, polyethersulfone resins, polysulfone resins, polycarbonate resins, polyolefin resins, polyallylate resins, polystyrene resins, polyvinyl alcohol resins, polyvinyl chloride resins, polyvinylidene chloride resins, and polyacrylic resins.
5. The light emitting device of claim 1, wherein the transparent fine particles are made of at least one material selected from the group consisting of silica, alumina, titania, zirconia, tin oxide, indium oxide, cadmium oxide and antimony oxide.
6. The light emitting device of claim 1, wherein the excitation source is a light emitting diode (LED) chip or a semiconductor laser.
7. The light emitting device of claim 1, wherein the excitation source emits light in the wavelength range of 200 to 2,000 nm.
8. The light emitting device of claim 1, wherein the light conversion layer contains at least one luminescent material selected from the group consisting of nanocrystals, inorganic phosphors and organic phosphors.

9. The light emitting device of claim 1, wherein the light conversion layer absorbs light from the excitation source to emit light with a higher or lower energy than the absorbed light.

10. The light emitting device of claim 8, wherein the nanocrystals are semiconductor nanocrystals of at least one compound selected from Group II-VI compounds, Group III-V compounds, Group IV-VI compounds, and Group IV compounds.

11. The light emitting device of claim 1, wherein the light conversion layer is a luminescent material-metal oxide composite film or a luminescent material-polymer composite film.

12. The light emitting device of claim 11, wherein the metal oxide is selected from the group consisting of $TiO_2$, $ZnO$, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, $CeO$, $CrO_3$ and mixtures thereof.

13. The light emitting device of claim 11, wherein the polymer is selected from the group consisting of styrene polymers, acrylate polymers, carbonate polymers, ethylene polymers, siloxane polymers, epoxy polymers, and mixtures thereof.

14. The light emitting device of claim 1, wherein the light conversion layer includes two or more layers whose emission wavelength ranges are different from the emission wavelength range of the excitation source and the constituent layers emit light in different wavelength ranges.

15. A method for fabricating a light emitting device, the method comprising
preparing a circuit board having a recess on which a reflection plane and an excitation source are mounted,
applying a resin within the recess of the circuit board to form an overmolding covering the reflection plane and the excitation source,
forming a surface-inducing film on the overmolding,
curing the resin (primary curing),
forming a light conversion layer on the surface-inducing film, and
curing the resulting structure (secondary curing), wherein the surface-inducing film is a transparent polymer film, a transparent glass film, or a polymer film blended with transparent fine particles.

16. The method of claim 15, wherein the overmolding is formed of an epoxy or silicone polymer.

17. The method of claim 15, wherein the excitation source is a light emitting diode (LED) chip or a semiconductor laser.

18. The method of claim 15, wherein the light conversion layer contains at least one luminescent material selected from the group consisting of nanocrystals, inorganic phosphors and organic phosphors.

* * * * *